(12) United States Patent
Tapily

(10) Patent No.: US 10,580,644 B2
(45) Date of Patent: Mar. 3, 2020

(54) METHOD AND APPARATUS FOR SELECTIVE FILM DEPOSITION USING A CYCLIC TREATMENT

(71) Applicant: Tokyo Electron Limited, Minato-ku, Tokyo (JP)

(72) Inventor: Kandabara N. Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 180 days.

(21) Appl. No.: 15/644,533

(22) Filed: Jul. 7, 2017

(65) Prior Publication Data

US 2018/0012752 A1  Jan. 11, 2018

Related U.S. Application Data

(60) Provisional application No. 62/360,903, filed on Jul. 11, 2016.

(51) Int. Cl.
*H01L 21/02* (2006.01)
*H01L 21/3065* (2006.01)
(Continued)

(52) U.S. Cl.
CPC .......... *H01L 21/0228* (2013.01); *C23C 16/04* (2013.01); *C23C 16/405* (2013.01);
(Continued)

(58) Field of Classification Search
CPC ............. H01L 21/0228; H01L 21/3065; H01L 21/02189; H01L 21/02181; H01L 21/3105; H01L 21/0262; H01L 21/02554; H01L 21/32; C23C 16/45525; C23C 16/04; C23C 16/405
(Continued)

(56) References Cited

U.S. PATENT DOCUMENTS 8,178,439 B2  5/2012 Tohnoe et al.
8,242,019 B2  8/2012 Ishizaka et al.
(Continued)

FOREIGN PATENT DOCUMENTS

JP  2011023456 A  2/2011
JP  2016512390 A  4/2016
KR  10-2012-0025597 A  3/2012

OTHER PUBLICATIONS

Japan Patent Office, Office Action in related Japan Patent Application No. 2017-134474, dated Jan. 8, 2019, 3 pages.
(Continued)

*Primary Examiner* — Michael P Wieczorek
*Assistant Examiner* — Michael G Miller

(57) ABSTRACT

A method is provided for selective film deposition on a substrate. According to one embodiment, the method includes providing a substrate containing a first material having a first surface and second material having a second surface, where the first material includes a dielectric material and the second material contains a semiconductor material or a metal-containing material that excludes a metal oxide, reacting the first surface with a reactant gas containing a hydrophobic functional group to form a hydrophobic first surface, and depositing, by gas phase deposition, a metal oxide film on the second surface, where deposition of the metal oxide film is hindered on the hydrophobic first surface.

20 Claims, 11 Drawing Sheets

(51) Int. Cl.
*C23C 16/40* (2006.01)
*H01L 21/32* (2006.01)
*H01L 21/3105* (2006.01)
*C23C 16/04* (2006.01)
*C23C 16/455* (2006.01)
*H01L 21/768* (2006.01)

(52) U.S. Cl.
CPC .... *C23C 16/45525* (2013.01); *H01L 21/0262* (2013.01); *H01L 21/02181* (2013.01); *H01L 21/02189* (2013.01); *H01L 21/02554* (2013.01); *H01L 21/3065* (2013.01); *H01L 21/3105* (2013.01); *H01L 21/32* (2013.01); *H01L 21/76826* (2013.01); *H01L 21/76834* (2013.01)

(58) Field of Classification Search
USPC .............................. 427/248.1–255.7, 569–579
See application file for complete search history.

(56) References Cited

U.S. PATENT DOCUMENTS

| | | | |
|---|---|---|---|
| 2012/0114869 A1* | 5/2012 | Miyoshi | C23C 16/02 427/489 |
| 2014/0246641 A1 | 9/2014 | Jameson, III et al. | |
| 2016/0172189 A1* | 6/2016 | Tapily | C23C 16/02 427/489 |
| 2017/0110368 A1 | 4/2017 | Yu et al. | |
| 2017/0342553 A1 | 11/2017 | Yu et al. | |

OTHER PUBLICATIONS

Japan Patent Office, Office Action in related Japan Patent Application No. 2017-134474, dated May 8, 2018, 4 pages.
Korean Intellectual Property Office, Office Action in related Korean Patent Application No. 10-2017-0087813, dated Jan. 11, 2019, 11 pages.

* cited by examiner

METHOD AND APPARATUS FOR SELECTIVE FILM DEPOSITION USING A CYCLIC TREATMENT

CROSS-REFERENCE TO RELATED APPLICATIONS

This application is related to and claims priority to U.S. Provisional Patent Application Ser. No. 62/360,903 filed on Jul. 11, 2016, the entire contents of which are herein incorporated by reference.

FIELD OF THE INVENTION

The present invention generally relates to a method of selective deposition of a film on different material surfaces using gas phase deposition.

BACKGROUND OF THE INVENTION

As device size is getting smaller at the 14 nm technology node, the complexity in manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Self-aligned patterning may replace overlay-driven patterning so that cost-effective scaling can continue even after extreme ultraviolet lithography (EUV) introduction. Patterning options that enable reduced variability, extend scaling and enhanced CD and process control are needed.

Selective deposition of thin films is a key step in patterning in highly scaled technology nodes. Selective film deposition has been achieved through the use of self-assembled monolayers (SAMs). However, SAMs suffer from poor thermal stability and added process complexity due to the requirement of depositing additional materials. New deposition methods are required that provide selective film deposition on different material surfaces.

SUMMARY OF THE INVENTION

Embodiments of the invention describe a method for selective deposition of a metal oxide film on different material surfaces using gas phase deposition. According to one embodiment, the method includes providing a substrate containing a first material having a first surface and second material having a second surface, where the first material includes a dielectric material and the second material contains a semiconductor material or a metal-containing material that excludes a metal oxide. The method further includes reacting the first surface with a reactant gas containing a hydrophobic functional group to form a hydrophobic first surface, and depositing, by gas phase deposition, a metal oxide film on the second surface, wherein deposition of the metal oxide film is hindered on the hydrophobic first surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

A method for selective deposition of a metal oxide film on different material surfaces using gas phase deposition is disclosed in various embodiments. A non-polymer based approach is provided for selectively depositing a metal oxide film (e.g., insulator or metal) on a desired surface of a substrate while inhibiting the metal oxide film deposition on the rest of the substrate. This reduces or eliminates the need for additional patterning steps that normally include lithography and etching steps.

Embodiments of the invention provide a method for modifying dielectric material surfaces, thereby hindering metal oxide deposition on the modified dielectric material surfaces. This allows for selective metal oxide deposition on unmodified material surfaces where the deposition proceeds readily, including on semiconductor material surfaces and on metal-containing surfaces.

According to one embodiment, the method includes providing a substrate containing a first material having a first surface and second material having a second surface, where the first material includes a dielectric material and the second material contains a semiconductor material or a metal-containing material that excludes a metal oxide, reacting the first surface with a reactant gas containing a hydrophobic functional group to form a hydrophobic first surface, and depositing, by gas phase deposition, a metal oxide film on the second surface, where deposition of the metal oxide film is hindered on the hydrophobic first surface. According to one embodiment, the first material can include an oxide surface and the second material can include a non-oxide surface.

Figure 1:
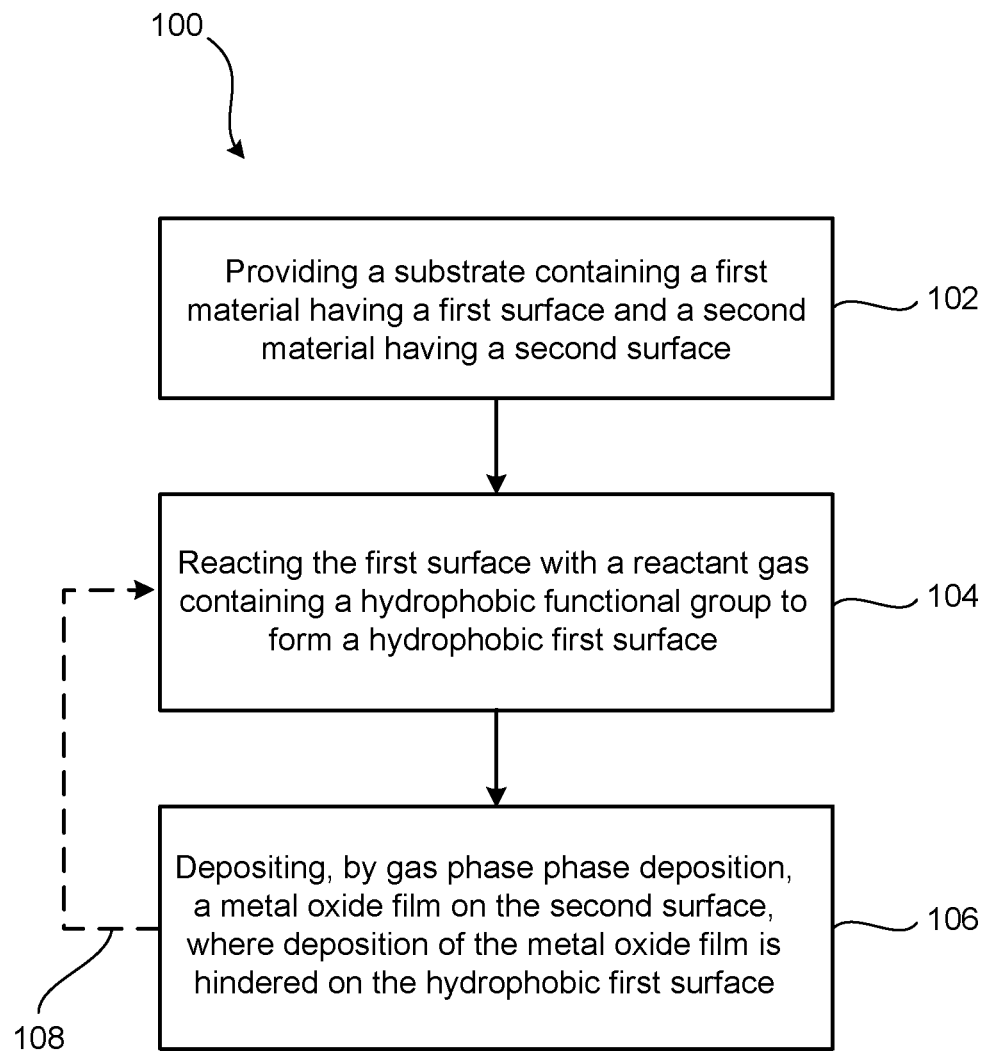
FIG. 1 shows a process flow for selective film deposition on a substrate according to an embodiment of the invention.
Figure 2A:
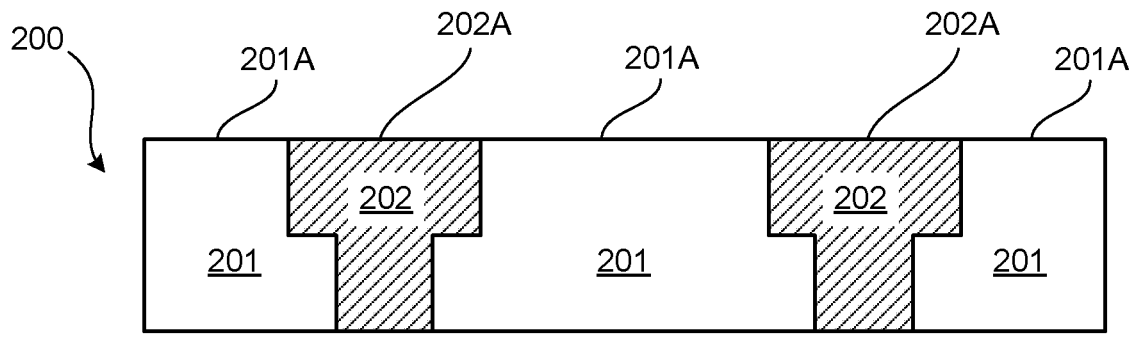
FIGS. 2A-2C schematically show cross-sectional views of selective film deposition on a substrate according to an embodiment of the invention.

FIG. 1 shows a process flow 100 for selective film deposition on a substrate according to an embodiment of the invention. Referring also to FIG. 2A, the process flow 100 includes, in 102, providing a substrate 200 containing a first material 201 having a first surface 201A and a second material 202 having a second surface 202A, where the first material 201 includes a dielectric material and the second material 202 contains a semiconductor material or a metal-containing material that excludes a metal oxide. In the embodiment shown in FIG. 2A, the first surface 201A and the second surface 202A are horizontal surfaces that lie at least substantially in the same plane.

The first material 201 can, for example, contain $SiO_2$, a low-k dielectric material, or a high-k dielectric material. Low-k dielectric materials have a nominal dielectric constant less than the dielectric constant of $SiO_2$, which is approximately 4 (e.g., the dielectric constant for thermally grown silicon dioxide can range from 3.8 to 3.9). High-k dielectric materials have a nominal dielectric constant greater than the dielectric constant of $SiO_2$.

Low-k dielectric materials may have a dielectric constant of less than 3.7, or a dielectric constant ranging from 1.6 to 3.7. Low-k dielectric materials can include fluorinated silicon glass (FSG), carbon doped oxide, a polymer, a SiCOH-containing low-k material, a non-porous low-k material, a porous low-k material, a spin-on dielectric (SOD) low-k material, or any other suitable dielectric material. Low-k dielectric materials include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

In addition, low-k materials include a silicate-based material, such as hydrogen silsesquioxane (HSQ) or methyl silsesquioxane (MSQ), deposited using SOD techniques. Examples of such films include FOx® HSQ commercially available from Dow Corning, XLK porous HSQ commercially available from Dow Corning, and JSR LKD-5109 commercially available from JSR Microelectronics.

According to one embodiment, the metal-containing material may be selected from the group consisting of a metal, a metal nitride, and a combination thereof. In one example, the metal-containing material may be selected from the group consisting of W, Cu, Co, Ru, TiN, TaN, TaSiN, TiSiN, CoSi, and a combination thereof. In one example, the semiconductor material may be selected from the group consisting of Si, Ge, and a combination thereof.

Figure 2B:
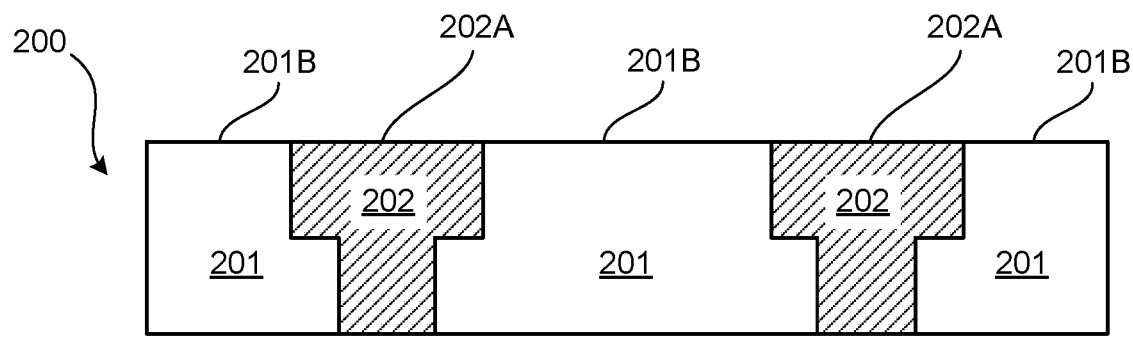

The process flow 100 further includes, in 104, reacting the first surface 201A with a reactant gas containing a hydrophobic functional group to form a hydrophobic first surface 201B shown in FIG. 2B. According to one embodiment, the method further includes removing an oxide layer from the second surface 202A to render the second surface 202A substantially oxygen-free prior to the exposure to the reactant gas. In one example, the removing can include a chemical oxide removal (COR) process.

According to some embodiments of the invention, the reactant gas can contain a silicon-containing gas, including an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof.

According to some embodiments of the invention, the reactant gas may be selected from dimethylsilyldimethylamine (DMSDMA), trimethylsilyldimethylamine (TMSDMA), bis(dimethylamino) dimethylsilane (BDMADMS), and other alkyl amine silanes. According to other embodiments, the reactant gas may be selected from N,O bistrimethylsilyltrifluoroacetamide (BSTFA) and trimethylsilylpyrrole (TMS-pyrrole).

According to some embodiments of the invention, the reactant gas may be selected from silazane compounds. Silazanes are saturated silicon-nitrogen hydrides. They are analogous in structure to siloxanes with —NH— replacing —O—. An organic silazane precursor can further contain at least one alkyl group bonded to the Si atom(s). The alkyl group can, for example, be a methyl group, an ethyl group, a propyl group, or a butyl group, or combinations thereof. Furthermore, the alkyl group can be a cyclic hydrocarbon group such as a phenyl group. In addition, the alkyl group can be a vinyl group. Disilazanes are compounds having from 1 to 6 methyl groups attached to the silicon atoms or having 1 to 6 ethyl groups attached the silicon atoms, or a disilazane molecule having a combination of methyl and ethyl groups attached to the silicon atoms.

In one embodiment, the first surface 201A may contain a thin layer of —OH termination, for example Si—OH, and the exposure to the reactant gas substitutes the —OH termination on the first surface 201A with the hydrophobic functional group, for example —SiMe$_3$, in the reactant gas. The hydrophobic functional group is thus methyl-terminated. The presence of the hydrophobic functional group hinders deposition of a metal oxide film on the hydrophobic first surface 201B. In contrast to the first surface 201A, the second surface 202A is not modified by the reactant gas.

Figure 2C:
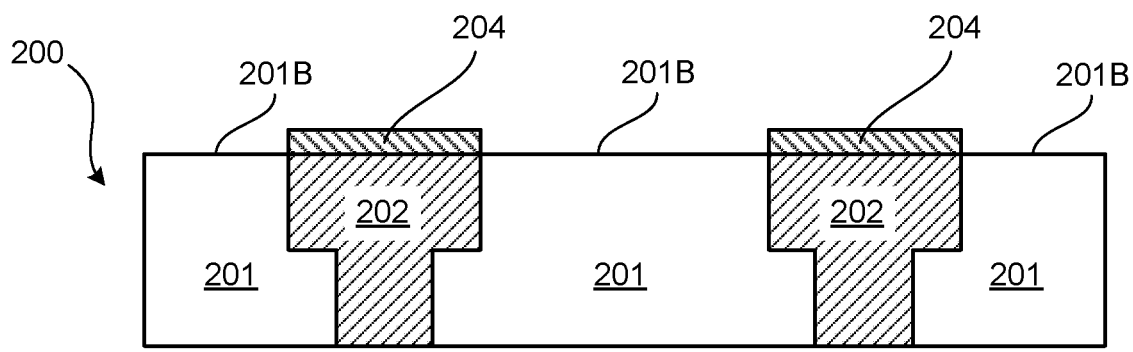

The process flow 100 further includes, in 106, depositing, by gas phase deposition, a metal oxide film 204 on the second surface 202A, where deposition of the metal oxide film 204 is hindered on the hydrophobic first surface 201B as shown in FIG. 2C. In one example, the metal oxide film 204 may serve as a cap layer on the second surface 202A.

The metal oxide film can, for example, be deposited by atomic layer deposition (ALD), plasma-enhanced ALD (PEALD), chemical vapor deposition (CVD), plasma-enhanced CVD (PECVD), or pulsed CVD. According to one embodiment, the metal oxide film may be selected from the group consisting of $HfO_2$, $ZrO_2$, $TiO_2$, $Al_2O_3$, and a combination thereof. In some examples, the metal oxide film may be deposited by ALD using alternating exposures of a metal organic precursor and an oxidizer (e.g., $H_2O$, $H_2O_2$, plasma-excited $O_2$ or $O_3$).

Steps 104 and 106 may be repeated at least once as indicated by process arrow 108 to increase the thickness of the metal oxide film 204 on the second surface 202A and to increase the selectivity of the deposition process. Repeating step 104 can replenish any hydrophobic functional group lost from the hydrophobic first surface 201B by desorption following the saturation exposure. Repeating steps 104 and 106 one or more times extends the incubation period for deposition on the hydrophobic first surface 201B and provides improved selective metal oxide film deposition on the second surface 202A.

Figure 3:
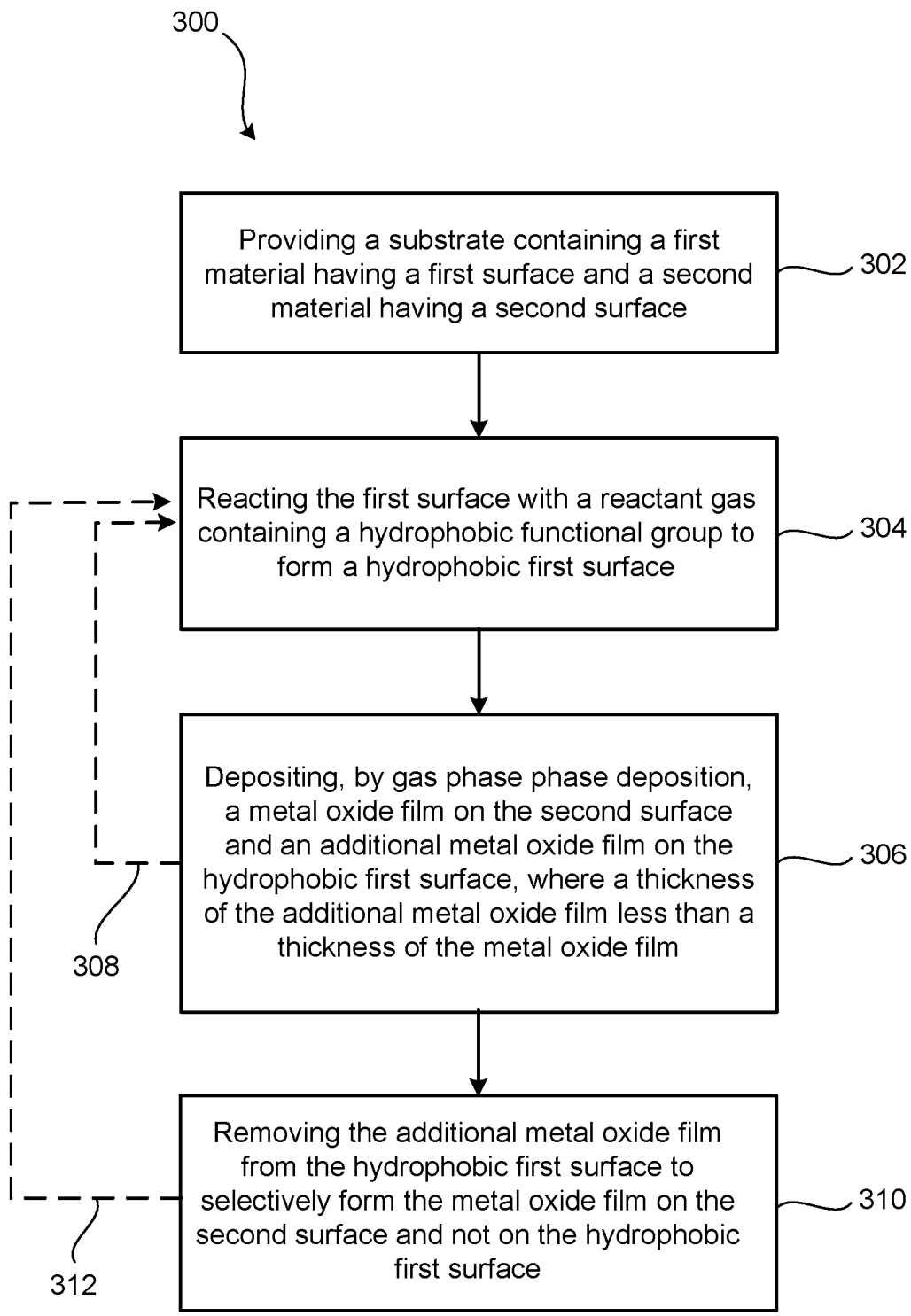
FIG. 3 shows a process flow for selective film deposition on a substrate according to an embodiment of the invention.

FIG. 3 shows a process flow 300 for selective film deposition on a substrate according to an embodiment of the invention. Steps 302-306 are similar to steps 102-106 in the process flow 100 in FIG. 1. Referring also to FIGS. 4A-4D, the process flow 300 includes, in 302, providing a substrate 400 containing a first material 401 having a first surface 401A and a second material 402 having a second surface 402A, where the first material 401 includes a dielectric material and the second material 402 contains a semiconductor material or a metal-containing material that excludes a metal oxide.

Figure 4A:
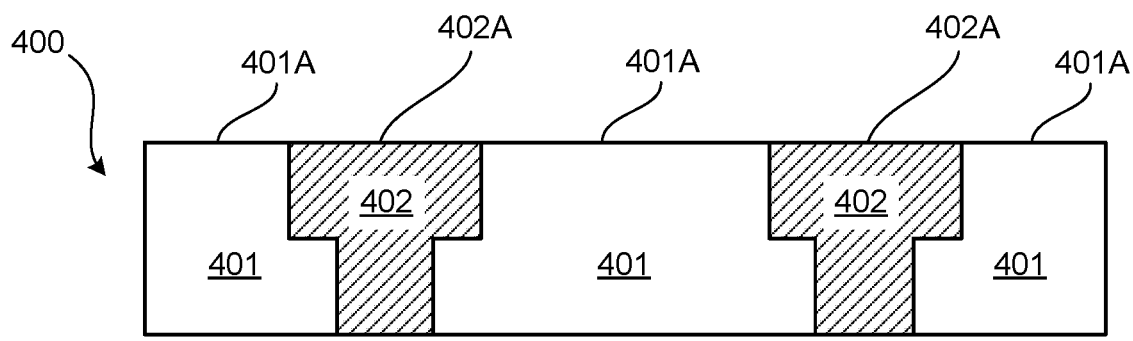
FIGS. 4A-4D schematically show cross-sectional views of selective film deposition on a substrate according to an embodiment of the invention.
Figure 4B:
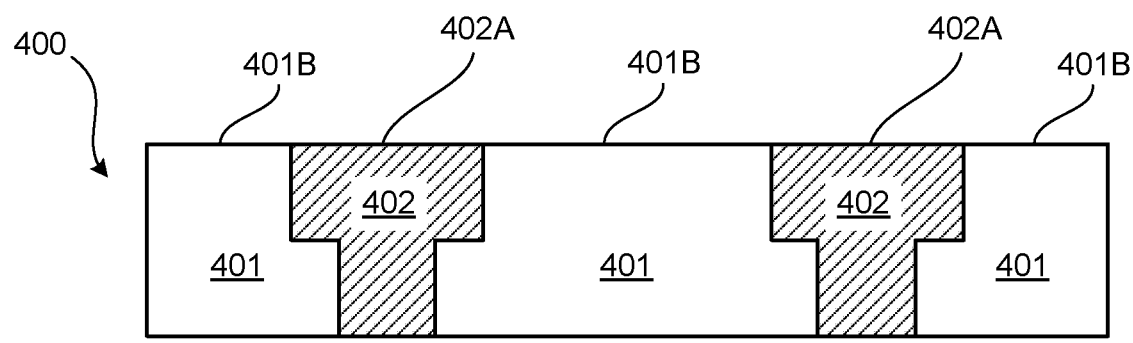
Figure 4C:
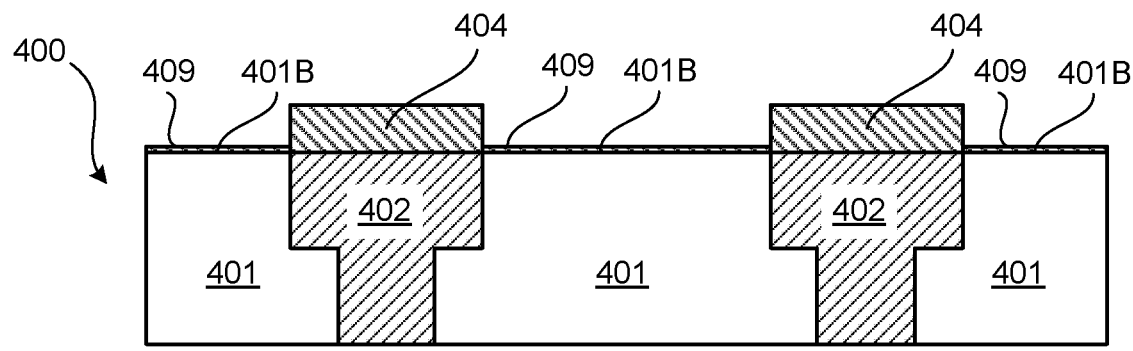

The process flow 300 further includes, in 304, reacting the first surface 401A with a reactant gas containing a hydrophobic functional group to form a hydrophobic first surface 401B shown in FIG. 4B. According to one embodiment, the method further includes removing an oxide layer from the second surface 402A to render the second surface 402A substantially oxygen-free prior to the exposure to the reactant gas. In one example, the removing can include a chemical oxide removal (COR) process.

The process flow 300 further includes, in 306, depositing, by gas phase deposition, a metal oxide film 404 on the second surface 402A and an additional metal oxide film 409 on the hydrophobic first surface 401B, where a thickness of the additional metal oxide film 409 is less than a thickness of the metal oxide film 404. This difference in thickness is due to the deposition of the additional metal oxide film 409 being hindered on the hydrophobic first surface 401B.

Steps 304 and 306 may be repeated at least once as indicated by process arrow 308 to increase the thickness of the metal oxide film 404 on the second surface 402A and to increase the selectivity of the deposition process. Repeating step 404 can replenish any hydrophobic functional group lost from the hydrophobic first surface 401B by desorption following the saturation exposure. Repeating steps 404 and 406 one or more times extends the incubation period for deposition on the hydrophobic first surface 401B and provides improved selective metal oxide film deposition on the second surface 402A.

Figure 4D:
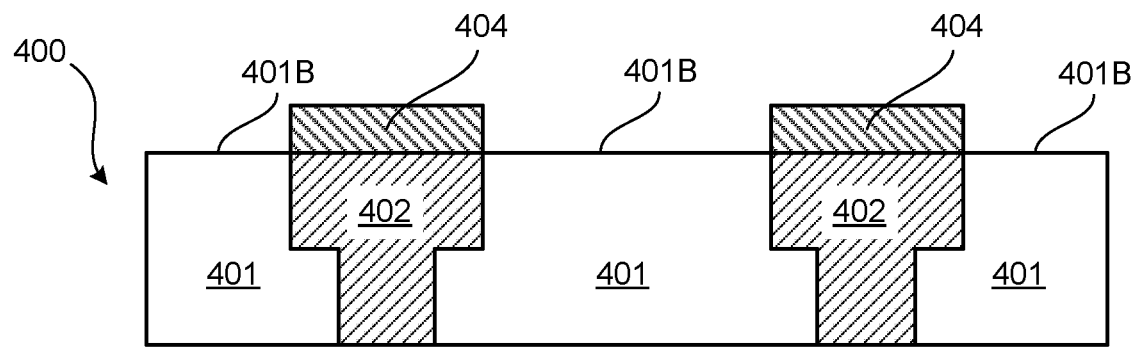

The process flow 300 further includes, in 310, removing the additional metal oxide film 409 from the hydrophobic first surface 401B to selectively form the metal oxide film 404 on the second surface 402A and not on the hydrophobic first surface 401B as shown in FIG. 4D. In one example, the removing includes an atomic layer etching (ALE) process.

Steps 304, 306, and 310 may be repeated at least once as indicated by process arrow 312. This extends the incubation period for the metal oxide deposition on the hydrophobic first surface 401B and provides improved selective metal oxide film formation on the second surface 402A.

According to one embodiment, the first surface includes a horizontal surface of the first material and a vertical surface of a recessed feature formed in the first material, and the second surface includes a surface of the metal-containing material in the recessed feature. In one example the surface of the metal-containing material can be a metallization layer at the bottom of the recessed feature.

Figure 12:
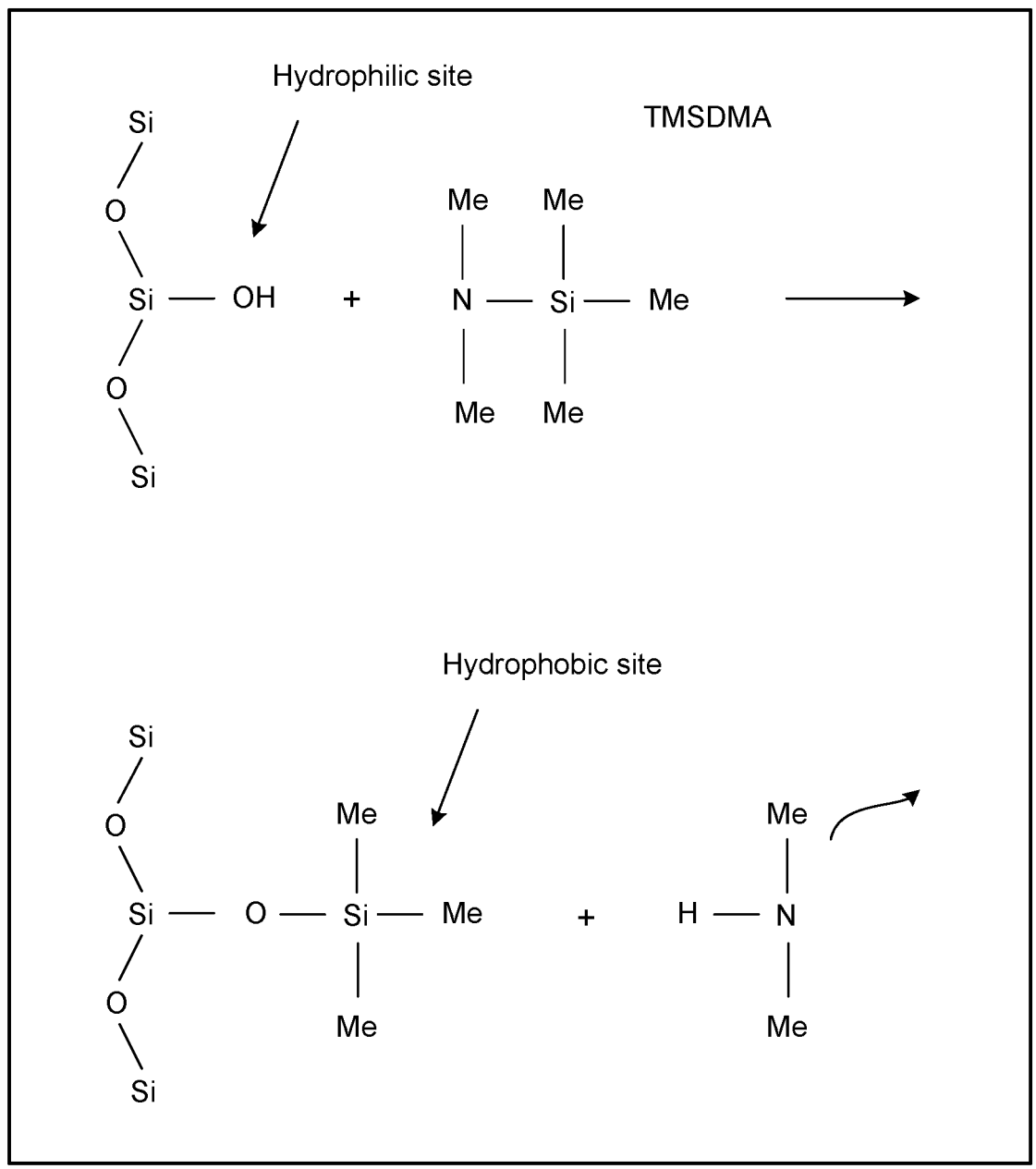
FIG. 12 schematically shows modification of a $SiO_2$ layer according to an embodiment of the invention.

FIG. 12 schematically shows modification of a $SiO_2$ layer according to an embodiment of the invention. The $SiO_2$ layer can, for example, include the first material 201 having the first surface 201A in FIG. 2A. A silylation gas, trimethylsilyldimethylamine (TMSDMA), is reacted with a hydrophilic site (—OH) on the $SiO_2$ layer to form a hydrophobic site (—SiMe$_3$) on the $SiO_2$ layer. A NHMe$_2$ group is desorbed from the $SiO_2$ layer following the reaction. The hydrophobic site hinders deposition of a metal oxide layer (e.g., $HfO_2$, $ZrO_2$) on the $SiO_2$ layer. The process of forming the hydrophobic site is also referred to as a low-k restoration (LKR).

Figure 5:
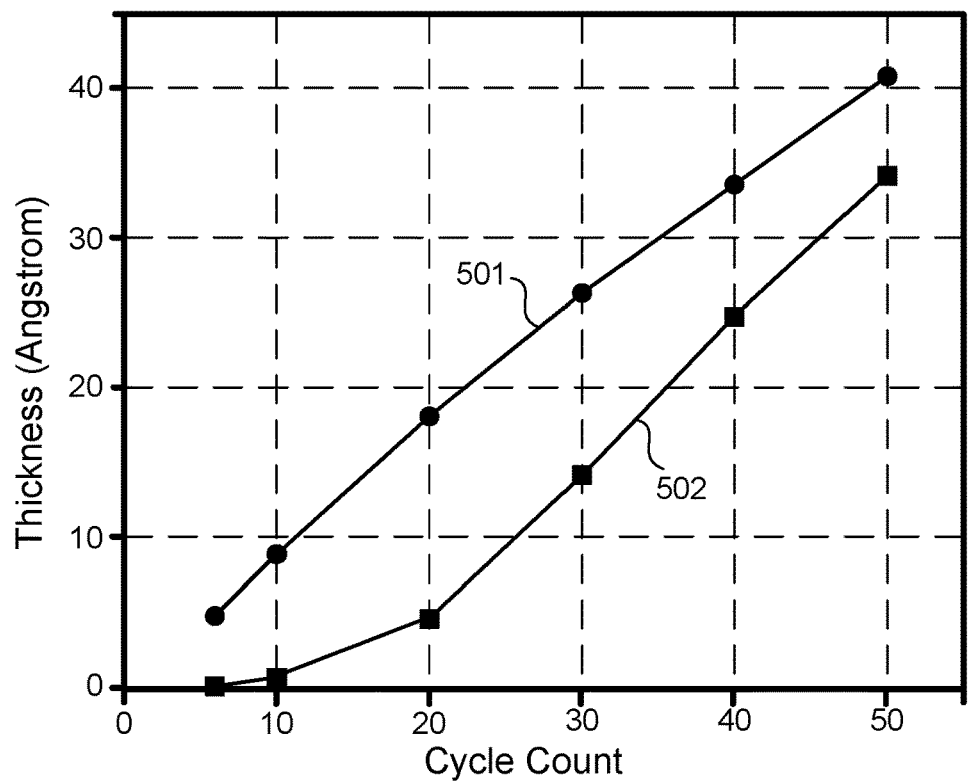
FIGS. 5-11 show effects of surface modification on film deposition on a substrate according to embodiments of the invention.

FIG. 5 shows effects of surface modification on film deposition on a substrate according to an embodiment of the invention. Trace 501 shows thickness of $HfO_2$ films deposited by ALD on a chemical oxide layer ($SiO_2$), and trace 502 shows thickness of $HfO_2$ films deposited by ALD on a modified chemical oxide layer. The chemical oxide layer was modified by an oversaturation exposure of TMSDMA. Both the ALD process and the modification of the chemical oxide layer were performed at a substrate temperature of 250° C., but in separate process chambers. Other embodiments contemplate performing the ALD process and the modification of the chemical oxide layer in the same process chamber. The cycle count refers to the number of alternating exposures of a hafnium precursor and an oxygen-containing gas during the ALD process. FIG. 5 shows that $HfO_2$ deposition was hindered on the modified chemical oxide layer. The hindered $HfO_2$ deposition is due to a nucleation delay provided by the adsorbed hydrophobic ligands (—SiMe$_3$) on the modified chemical oxide layer.

Figure 6:
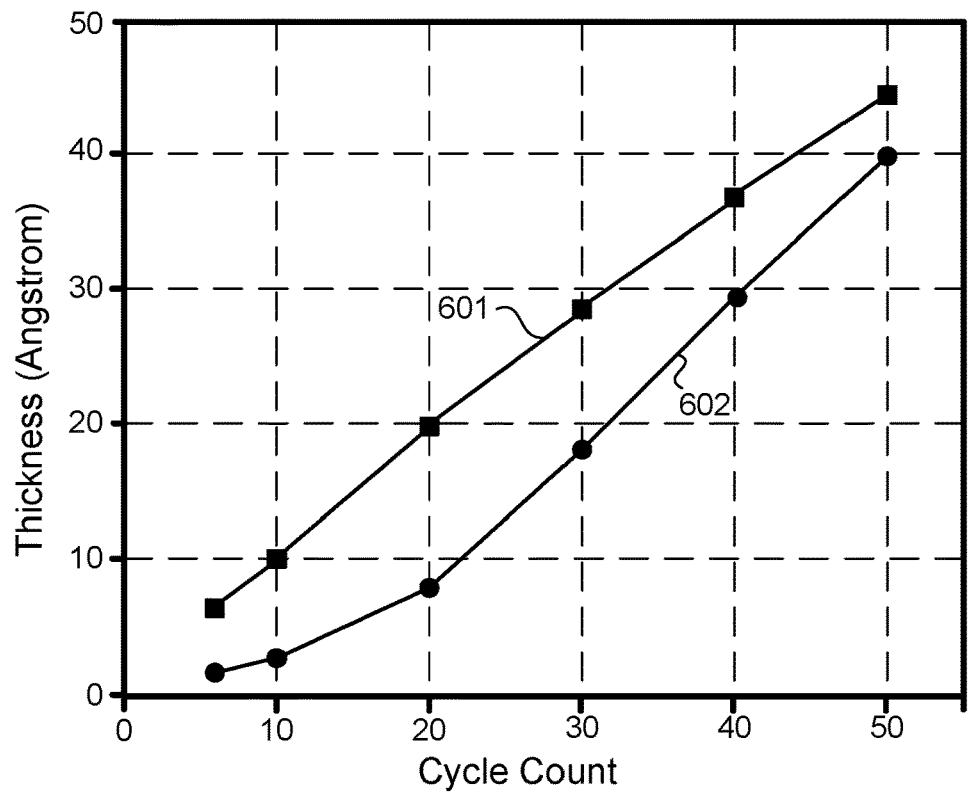

FIG. 6 shows effects of surface modification on film deposition on a substrate according to an embodiment of the invention. Trace 601 shows thickness of $ZrO_2$ films deposited ALD on a chemical oxide layer ($SiO_2$), and trace 602 shows thickness of $ZrO_2$ films deposited by ALD on a modified chemical oxide layer. The chemical oxide layer was modified by an oversaturation exposure TMSDMA. Both the ALD process and the modification of the chemical oxide layer were performed at a substrate temperature of 250° C. The cycle count refers to the number of alternating exposures of a zirconium precursor and an oxygen-containing gas during the ALD process. FIG. 6 shows that $ZrO_2$ deposition was hindered on the modified chemical oxide layer. The hindered deposition is due to a nucleation delay provided by the adsorbed hydrophobic ligands (—SiMe$_3$) on the modified chemical oxide layer.

Figure 7:
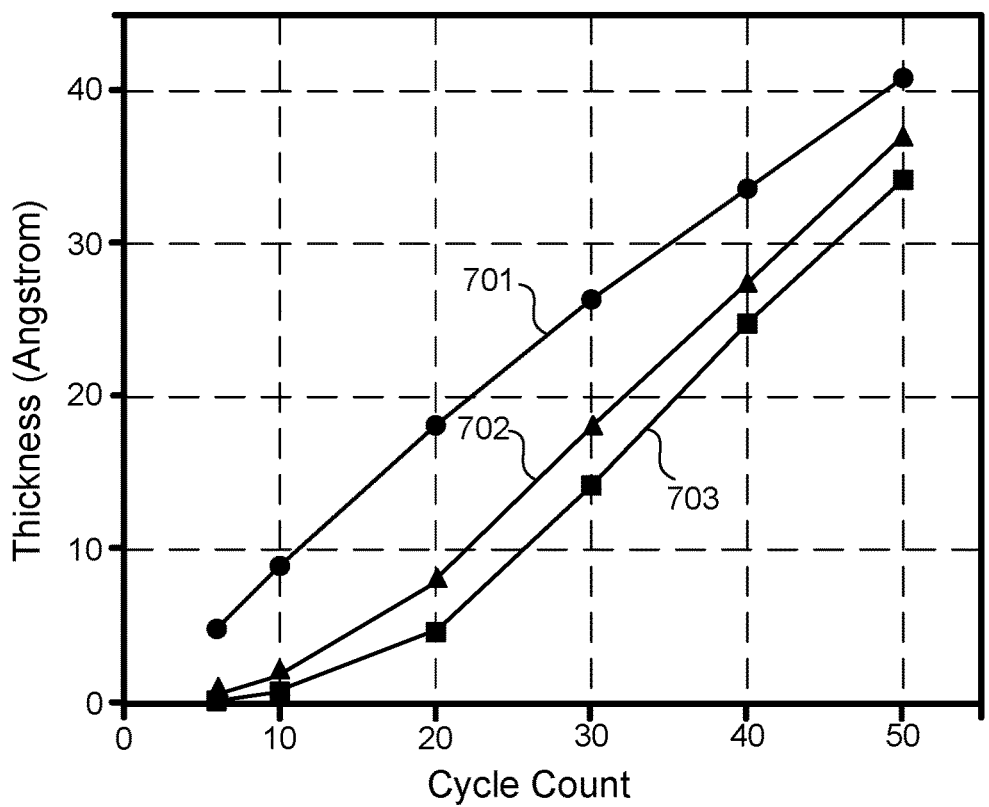

FIG. 7 shows effects of surface modification and substrate temperature on film deposition on a substrate according to an embodiment of the invention. Trace 701 shows thickness of $HfO_2$ films deposited by ALD on a chemical oxide layer ($SiO_2$) at a substrate temperature of 250° C. Trace 702 shows thickness of $HfO_2$ films deposited by ALD on a modified chemical oxide layer at a substrate temperature of 180° C., and trace 703 shows thickness of $HfO_2$ films deposited by ALD on a modified chemical oxide layer at a substrate temperature of 250° C. The chemical oxide layer was modified by an oversaturation exposure TMSDMA. The cycle count refers to the number of alternating exposures of a hafnium precursor and an oxygen-containing gas during the ALD process. FIG. 7 shows that $HfO_2$ deposition was hindered on the modified chemical oxide layer and also shows that a substrate temperature of 250° C. is more effective for selective deposition than the lower substrate temperature of 180° C.

Figure 8:
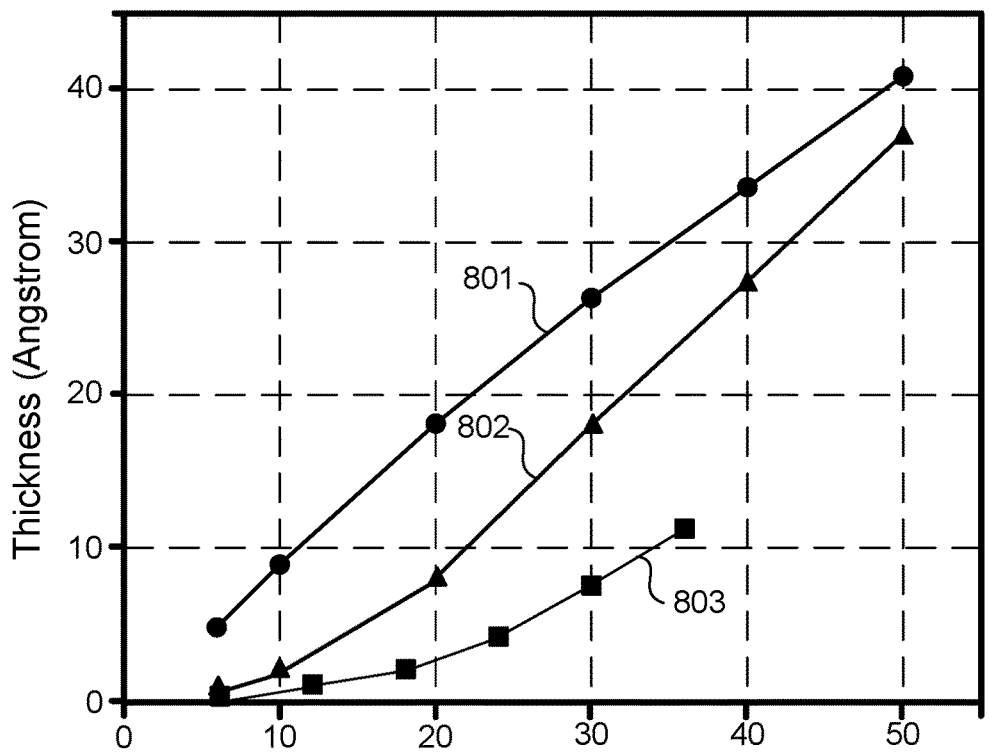

FIG. 8 shows effects of surface modification on film deposition on a substrate according to an embodiment of the invention. Trace 801 shows thickness of $HfO_2$ films deposited by ALD on a chemical oxide layer ($SiO_2$). Trace 802 shows thickness of $HfO_2$ films deposited by ALD on a modified chemical oxide layer. Trace 803 shows thickness of $HfO_2$ films deposited by ALD on a modified chemical oxide layer, where the surface modification was repeated between every 6 ALD cycles. The chemical oxide layer was modified by an oversaturation exposure TMSDMA. Both the ALD process and the modification of the chemical oxide layer were performed at a substrate temperature of 250° C. The cycle count refers to the number of alternating exposures of a zirconium precursor and an oxygen-containing gas during the ALD process. FIG. 8 shows that $HfO_2$ deposition was hindered on the modified chemical oxide layer, and that repeating the surface modification every 6 ALD cycles further hindered the $HfO_2$ deposition. The repeated surface modification is thought to replenish any hydrophobic functional group lost from the hydrophobic first surface by desorption following the saturation exposure.

Figure 9:
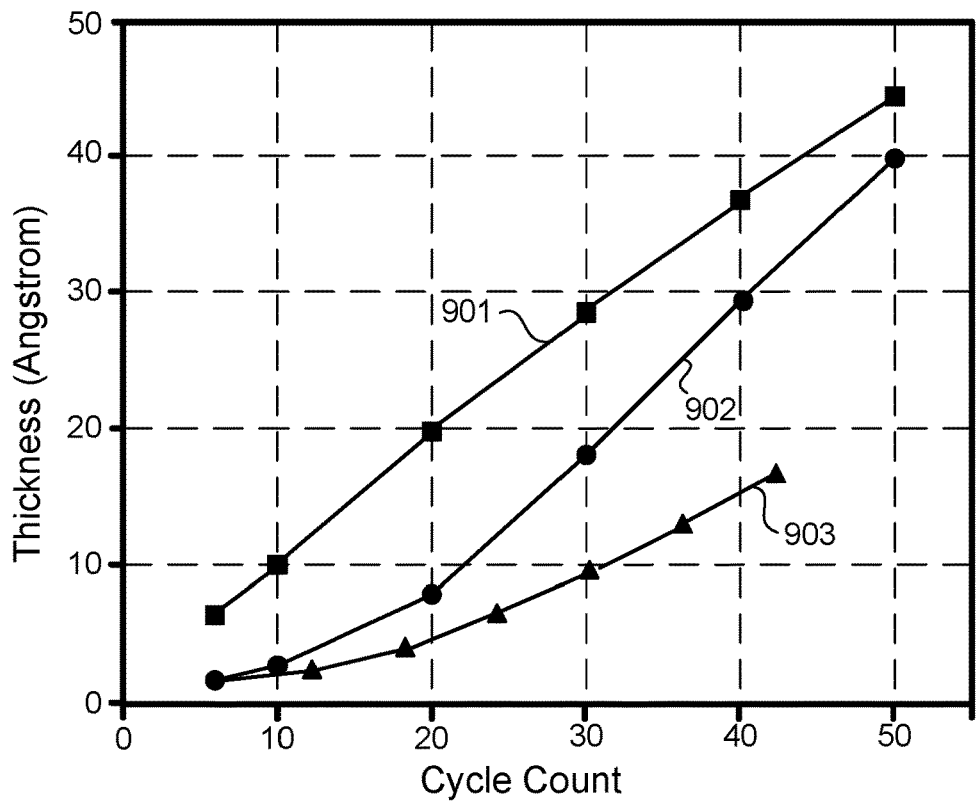

FIG. 9 shows effects of surface modification on film deposition on a substrate according to an embodiment of the invention. Trace 901 shows thickness of $ZrO_2$ films deposited ALD on a chemical oxide layer ($SiO_2$). Trace 902 shows thickness of $ZrO_2$ films deposited by ALD on a modified chemical oxide layer. Trace 903 shows thickness of $ZrO_2$ films deposited by ALD on a modified chemical oxide layer, where the surface modification was repeated every 6 ALD cycles. The chemical oxide layer was modified by an over-saturation exposure TMSDMA. Both the ALD process and the modification of the chemical oxide layer were performed at a substrate temperature of 250° C. The cycle count refers to the number of alternating exposures of a zirconium precursor and an oxygen-containing gas during the ALD process. FIG. 9 shows that $ZrO_2$ deposition is hindered on the modified chemical oxide layer, and that repeating the surface modification every 6 ALD cycles further hindered the $ZrO_2$ deposition. The repeated surface modification is thought to replenish any hydrophobic functional group lost from the hydrophobic first surface by desorption following the saturation exposure.

Figure 10:
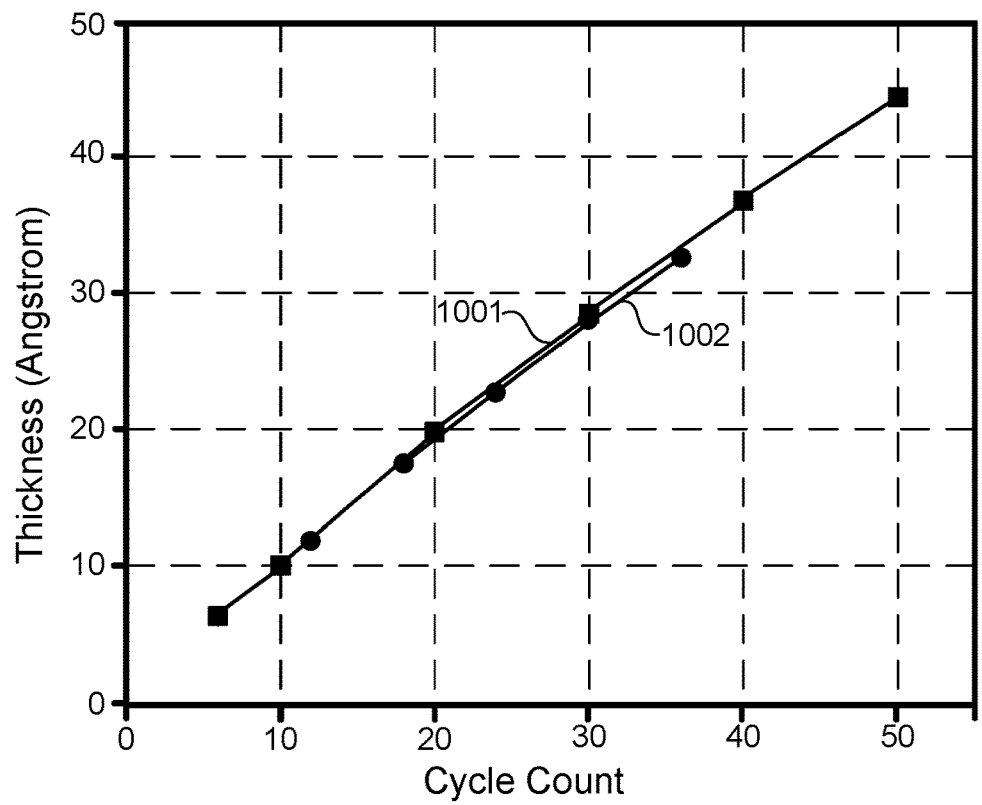
Figure 11:
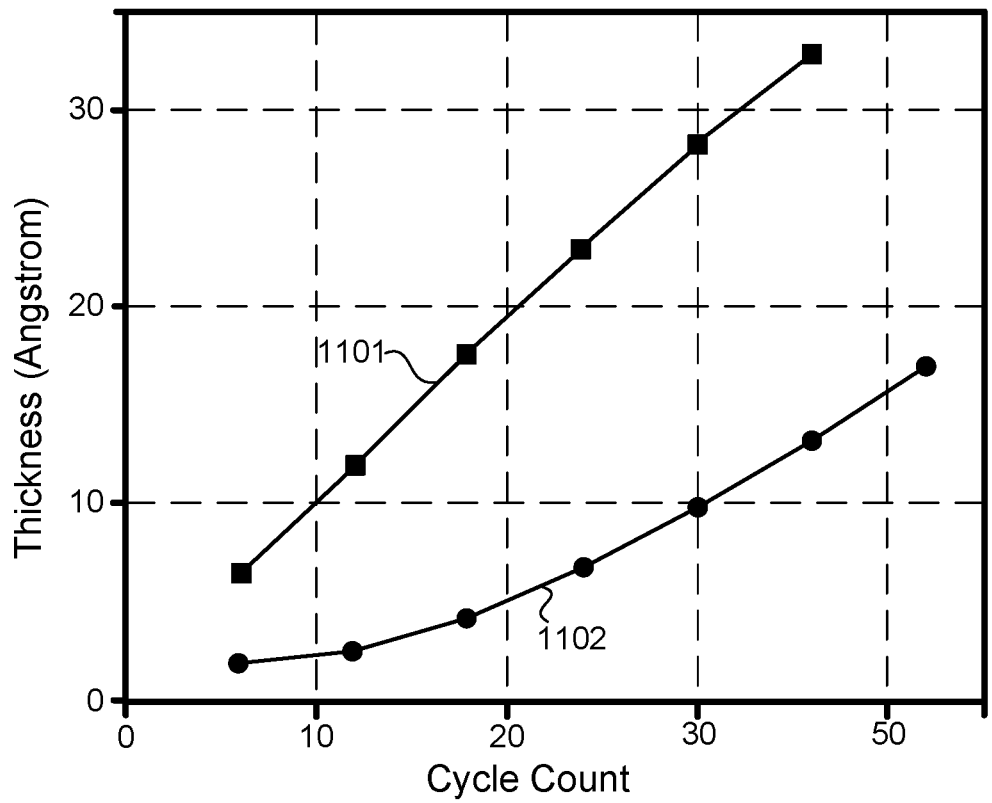

In FIG. 10, trace 1002 shows thickness of $ZrO_2$ films deposited by ALD on a chemical oxide layer ($SiO_2$), where the ALD process was interrupted every 6 cycles and the substrate moved from the ALD process chamber into a second process chamber where it was exposed to an inert gas. This was done in order to simulate the elapsed time during an exposure to a reactant gas to modify the chemical oxide layer. Trace 1001 shows thickness of $ZrO_2$ films deposited by ALD on a chemical oxide layer ($SiO_2$), where the ALD process was not interrupted as in trace 1002. FIG. 10 shows that $ZrO_2$ deposition was not affected by the ALD interruption and transfer in and out of the second process chamber. For comparison, FIG. 11 shows the effect of exposing the substrate to a saturation amount of TMSDMA in the second process chamber after every 6 ALD cycles. Trace 1101 shows thickness of $ZrO_2$ films deposited by ALD on a chemical oxide layer ($SiO_2$), and trace 1102 shows thickness of $ZrO_2$ films deposited by ALD on a chemical oxide layer ($SiO_2$), where the ALD process was interrupted every 6 cycles and the substrate moved from the ALD process chamber into a second process chamber where it was exposed to TMSDMA gas.

Figure 13:
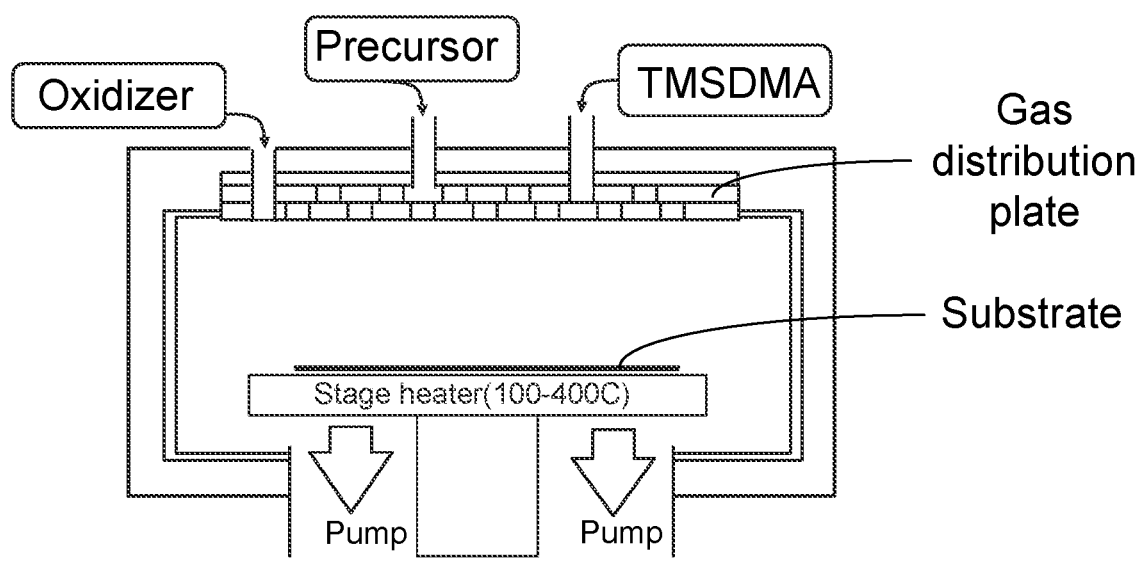
FIG. 13 schematically shows a processing system containing a single process chamber for selective film deposition using gas phase deposition according to an embodiment of the invention.

FIG. 13 schematically shows a processing system containing a single process chamber for selective film deposition using gas phase deposition according to an embodiment of the invention. The process chamber includes a substrate holder (stage heater) for supporting and heating a substrate, vacuum pumps for providing a reduced pressure environment in the process chamber, and a gas distribution plate for introducing gases into the process chamber. The gas distribution plate is fluidly connected to several gas sources, including a metal organic precursor (e.g., a hafnium-containing precursor or a zirconium-containing precursor), an oxidizer, and a reactant gas (e.g., TMSDMA). The process chamber may further be configured for creating a plasma-excited gas in the process chamber using a plasma source. In one example, the plasma-excited gas may be generated by a remote plasma source and flowed into the process chamber.

Figure 14:
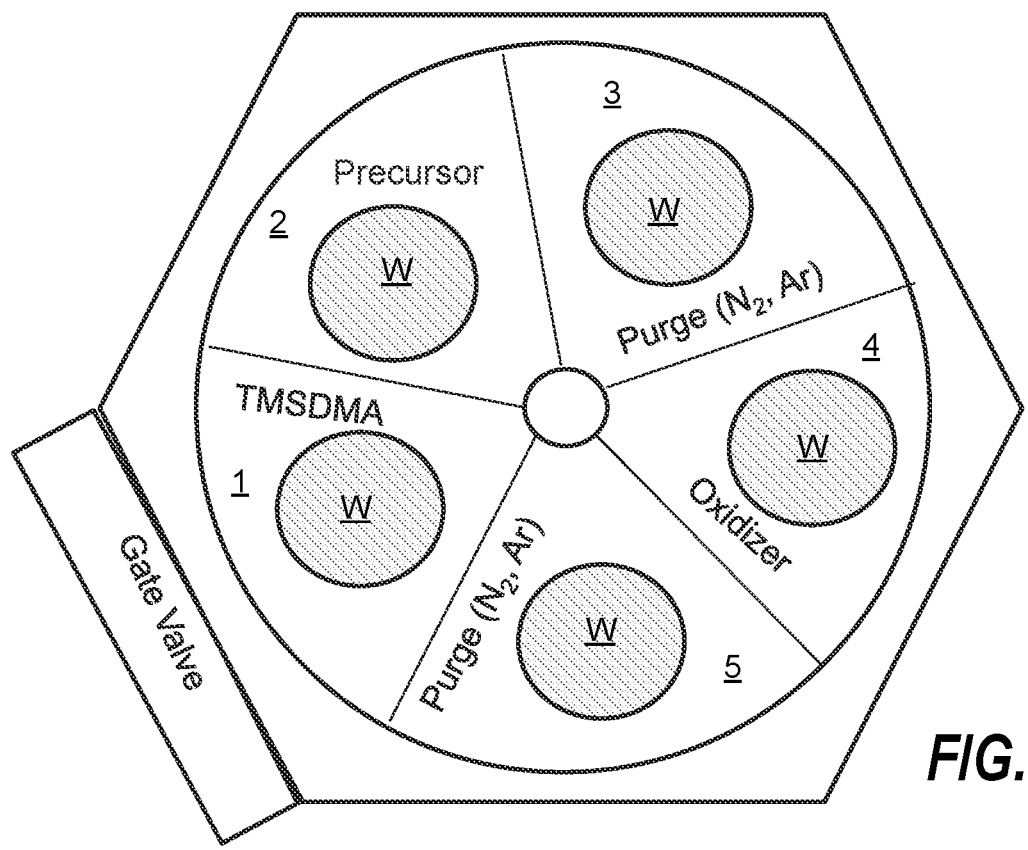
FIG. 14 schematically shows a processing system containing a plurality of process chambers for selective film deposition using gas phase deposition according to an embodiment of the invention.

FIG. 14 schematically shows a processing system containing a plurality of process chambers for selective film deposition using gas phase deposition according to an embodiment of the invention. The exemplary processing system contains five process chambers (compartments) that each of the five substrates (W) rotate through. The processing system includes peripheral sidewall partitions that divide the processing space into the separate process chambers (partitions). A rotating platter supports the substrates W within the processing space with controllable speed to control the exposure time in each process chamber. According to one embodiment, a substrate is processed in process chamber 1 by exposing the substrate to a reactant gas (e.g., TMSDMA), and thereafter, in process chamber 2, the substrate is exposed to a metal organic precursor. Thereafter, a purge using an inert gas is performed in process chamber 3 in order to remove excess metal organic precursor and by-products from the substrate. Thereafter, the substrate is exposed to an oxidizer in process chamber 4 to form a metal oxide film on the substrate. Thereafter, a purge using an inert gas is performed in process chamber 5 in order to remove excess oxidizer and by-products from the substrate. The processing in process chambers 2-5 may be repeated one or more times and each repeat corresponds to one ALD cycle. In some embodiments, the processing in process chamber 1 may be repeated after one or more ALD cycles. For example, the processing in process chamber 1 may be repeated every 6 ALD cycles. The processing system further includes a gate valve for transferring the substrates in and out of the processing system.

Figure 15:
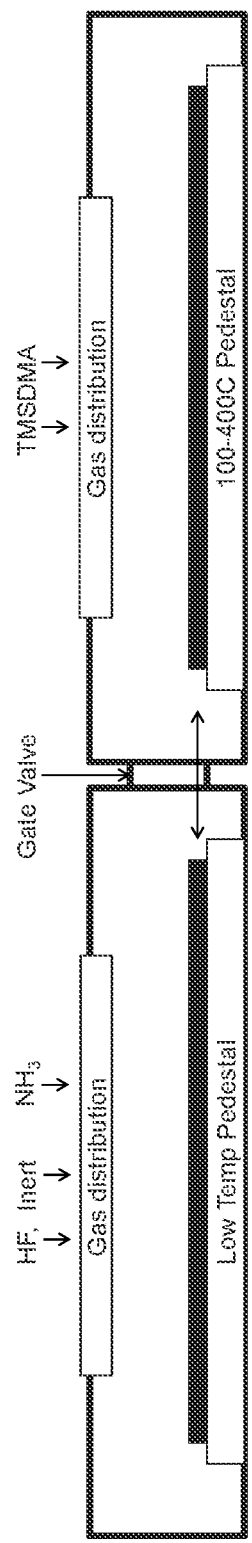
FIG. 15 schematically shows a processing system containing two process chambers according to an embodiment of the invention.

FIG. 15 schematically shows a processing system containing two process chambers according to an embodiment of the invention. The first process chamber is a chemical oxide removal (COR) chamber for rendering a substrate surface substantially oxygen-free. The COR chamber can be configured for alternating or simultaneous exposures of HF gas and $NH_3$ gas to form reaction by-products on the substrate surface. The second process chamber may be used for removing the reaction by-products from the substrate surface at an elevated temperature. The second process chamber may also be used for exposures to a reactant gas (e.g., TMSDMA) after the COR process. The two process chambers are maintained under vacuum conditions and thus allow for reactant gas exposure of a substrate surface that is substantially oxygen-free.

A plurality of embodiments for selective deposition of a film on different material surfaces using gas phase deposition have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. It is therefore intended that the scope of the invention be limited not by this detailed description, but rather by the claims appended hereto.

What is claimed is:

1. A method of selective film deposition on a substrate, the method comprising:

providing a substrate containing a first material having a first surface and second material having a second surface, wherein the first material includes a dielectric material and the second material contains a semiconductor material or a metal-containing material that excludes a metal oxide;

reacting the first surface with a reactant gas containing a hydrophobic functional group to form a hydrophobic first surface;

depositing, by gas phase deposition, a metal oxide film on the second surface, wherein deposition of the metal oxide film is hindered on the hydrophobic first surface, wherein the depositing further deposits an additional metal oxide film on the hydrophobic first surface, and wherein a thickness of the additional metal oxide film is less than a thickness of the metal oxide film; and removing the additional metal oxide film from the hydrophobic first surface to selectively form the metal oxide film on the second surface and not on the hydrophobic first surface.

2. The method of claim 1, further comprising:
repeating the reacting and depositing at least once.

3. The method of claim 1, wherein the removing includes an atomic layer etching (ALE) process.

4. The method of claim 1, further comprising
following the removing, repeating the reacting, depositing, and removing at least once.

5. The method of claim 1, wherein the first and second surfaces are horizontal surfaces that lie at least substantially in the same plane.

6. The method of claim 1, wherein the first surface is hydroxyl terminated and the hydrophobic first surface is methyl terminated.

7. The method of claim 1, wherein the metal-containing material is selected from the group consisting of a metal, a metal nitride, and a combination thereof.

8. The method of claim 1, wherein the metal-containing material is selected from the group consisting of W, Cu, Co, Ru, TiN, TaN, TaSiN, TiSiN, CoSi, and a combination thereof, and the semiconductor material is selected from the group consisting of Si, Ge, and a combination thereof.

9. The method of claim 1, wherein the metal oxide film is selected from the group consisting of $HfO_2$, $ZrO_2$, $TiO_2$, $Al_2O_3$, and a combination thereof.

10. The method of claim 1, wherein the dielectric material is selected from the group consisting of $SiO_2$, SiN, SiON, a low-k material, a high-k material, and a combination thereof.

11. The method of claim 1, wherein the reactant gas includes a silicon-containing gas.

12. The method of claim 11, wherein the silicon-containing gas is selected from the group consisting of an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, and combination thereof.

13. The method of claim 1, wherein the reactant gas is selected from the group consisting of dimethyl silyldimethylamine (DMSDMA), trimethylsilyldimethylamine (TMS-DMA), bis(dimethylamino) dimethylsilane (BDMADMS), N,O bistrimethylsilyltrifluoroacetamide (BSTFA), trimethylsilyl-pyrrole (TMS-pyrrole), and a combination thereof.

14. The method of claim 1, further comprising
prior to the reacting, removing an oxide layer from the second surface to render the second surface substantially oxygen-free.

15. A method of selective film deposition on a substrate, the method comprising:
providing a substrate containing a first material having a first surface and second material having a second surface, wherein the first material includes a dielectric material and the second material contains a metal-containing material that excludes a metal oxide, and wherein the first surface includes a horizontal surface of the first material and a vertical surface of a recessed feature formed in the first material, and the second surface includes a surface of the metal-containing material in the recessed feature;
reacting the first surface with a reactant gas containing a hydrophobic functional group to form a hydrophobic first surface;
depositing, by gas phase deposition, a metal oxide film on the second surface, wherein deposition of the metal oxide film is hindered on the hydrophobic first surface; and
repeating the reacting and depositing at least once to at least substantially fill the recessed feature with the metal oxide film.

16. The method of claim 15, wherein the metal oxide film is selected from the group consisting of $HfO_2$, $ZrO_2$, $TiO_2$, $Al_2O_3$, and a combination thereof.

17. A method of selective film deposition on a substrate, the method comprising:
providing a substrate containing a first material having a first surface and second material having a second surface, wherein the first material includes a dielectric material and the second material contains a metal-containing material that excludes a metal oxide, and wherein the first surface includes a horizontal surface of the first material and a vertical surface of a recessed feature formed in the first material, and the second surface includes a surface of the metal-containing material in the recessed feature;
reacting the first surface with a reactant gas containing a hydrophobic functional group to form a hydrophobic first surface;
depositing, by gas phase deposition, a metal oxide film on the second surface, wherein deposition of the metal oxide film is hindered on the hydrophobic first surface, wherein the depositing further forms an additional metal oxide film on the hydrophobic first surface, and wherein a thickness of the additional metal oxide film is less than a thickness of the metal oxide film; and
removing the additional metal oxide film from the hydrophobic first surface to selectively form the metal oxide film on the second surface and not on the hydrophobic first surface.

18. The method of claim 17, wherein the removing includes an atomic layer etching (ALE) process.

19. The method of claim 17, further comprising
following the removing, repeating the reacting, depositing, and removing at least once.

20. The method of claim 17, wherein the metal oxide film is selected from the group consisting of $HfO_2$, $ZrO_2$, $TiO_2$, $Al_2O_3$, and a combination thereof.

* * * * *